(12) United States Patent
Lazzaro

(10) Patent No.: US 10,398,064 B2
(45) Date of Patent: Aug. 27, 2019

(54) COOLING ARRANGEMENT FOR AIR CONDITIONING AN IT ENVIRONMENT AND ESPECIALLY FOR CLIMATE CONTROL IN A DATA PROCESSING CENTER

(71) Applicant: RITTAL GMBH & CO. KG, Herborn (DE)

(72) Inventor: Andrea Lazzaro, Noventa (IT)

(73) Assignee: Rittal GmbH & Co. KG (DE)

( * ) Notice: Subject to any disclaimer, the term of this patent is extended or adjusted under 35 U.S.C. 154(b) by 48 days.

(21) Appl. No.: 15/641,714

(22) Filed: Jul. 5, 2017

(65) Prior Publication Data

US 2018/0054925 A1 Feb. 22, 2018

(30) Foreign Application Priority Data

Aug. 16, 2016 (DE) .................. 10 2016 115 175

(51) Int. Cl.
*H05K 7/20* (2006.01)

(52) U.S. Cl.
CPC ....... *H05K 7/20827* (2013.01); *H05K 7/2079* (2013.01); *H05K 7/20263* (2013.01); *H05K 7/20745* (2013.01); *H05K 7/20172* (2013.01); *H05K 7/20309* (2013.01); *H05K 7/20318* (2013.01); *H05K 7/20327* (2013.01)

(58) Field of Classification Search
CPC ........... H05K 7/20827; H05K 7/20745; H05K 7/20327; H05K 7/20172; H05K 7/20318; H05K 7/20309
USPC ......................................... 62/94, 175, 259.2
See application file for complete search history.

(56) References Cited

U.S. PATENT DOCUMENTS

| 4,107,942 | A | * | 8/1978 | Fairman | .................. | F24F 5/001 |
| | | | | | | 62/305 |
| 4,313,310 | A | * | 2/1982 | Kobayashi | ................ | F24F 1/00 |
| | | | | | | 62/175 |

(Continued)

FOREIGN PATENT DOCUMENTS

| CN | 201110608 Y | 9/2008 |
| CN | 102252385 A | 11/2011 |

(Continued)

OTHER PUBLICATIONS

Office Action (in German) issued by the German Trademark and Patent Office dated Jun. 28, 2017 regarding German Patent Application No. 10 2016 115 175.0 (4 pages).

*Primary Examiner* — Ana M Vazquez
(74) *Attorney, Agent, or Firm* — Harness, Dickey & Pierce, PLC

(57) ABSTRACT

A cooling arrangement for air conditioning an IT environment and especially for climate control in a data processing center, in which a first heat exchanger packet and a least a first blower are incorporated, wherein the first blower is set up to draw air from the building or the data processing center over a first of two oppositely positioned housing sides, convey it through the housing and the first heat exchanger packet and blow it out of the housing over a second housing side located opposite the first housing side, and wherein outside of the building or data processing center a second heat exchanger packet is disposed and air is blown through it by at least one second blower.

7 Claims, 1 Drawing Sheet

(56) References Cited

U.S. PATENT DOCUMENTS

| | | | | |
|---|---|---|---|---|
| 4,406,138 | A * | 9/1983 | Nelson | F24F 5/001 |
| | | | | 62/119 |
| 5,718,628 | A * | 2/1998 | Nakazato | F24F 3/044 |
| | | | | 454/184 |
| 6,018,954 | A * | 2/2000 | Assaf | F24F 3/1411 |
| | | | | 62/271 |
| 7,855,890 | B2 * | 12/2010 | Kashirajima | F25B 25/00 |
| | | | | 361/679.46 |
| 8,322,159 | B2 | 12/2012 | Park | |
| 2012/0216554 | A1 | 8/2012 | Liu | |

FOREIGN PATENT DOCUMENTS

| | | |
|---|---|---|
| DE | 102013111053 A1 | 7/2014 |
| EP | 736161 B1 | 10/1999 |

* cited by examiner

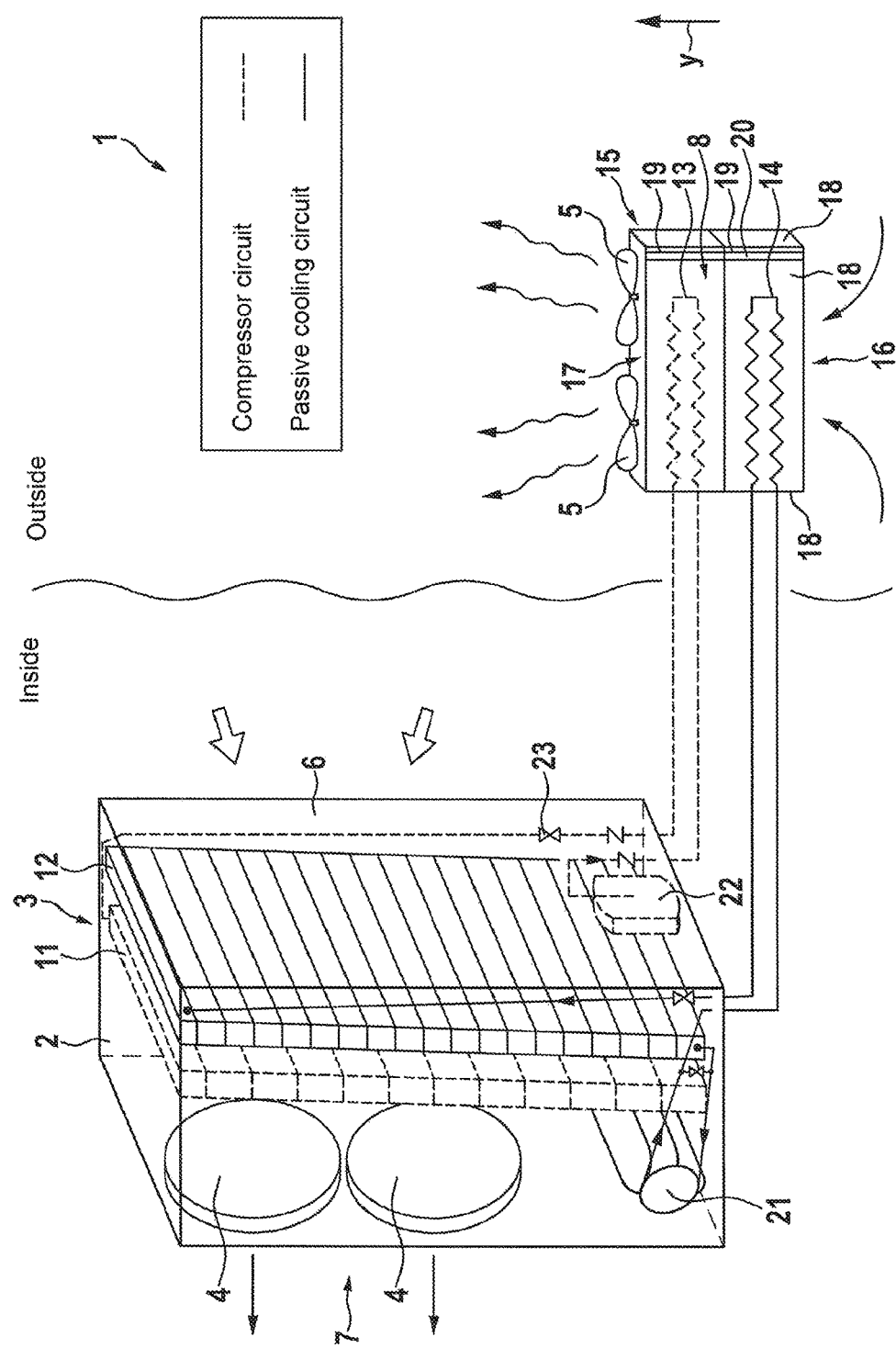

COOLING ARRANGEMENT FOR AIR CONDITIONING AN IT ENVIRONMENT AND ESPECIALLY FOR CLIMATE CONTROL IN A DATA PROCESSING CENTER

CROSS-REFERENCE TO RELATED APPLICATIONS

This application claims the benefit and priority of DE 10 2016 115 175.0, filed Aug. 16, 2016. The entire disclosure of the above application is incorporated herein by reference.

BACKGROUND OF THE INVENTION

The invention relates to a cooling arrangement for air conditioning an IT environment and especially for climate control in a data processing center, wherein the cooling arrangement has a cooling unit housing set up in an IT environment and especially in a data processing center, and in which a first heat exchanger packet and at least one first blower are accommodated. The first blower is arranged to draw air from the interior of the building or the data processing center over a first one of two opposite housing sides of the cooling unit housing, convey it through the cooling unit housing and the first heat exchanger packet, and to blow it out of the housing over a second housing side located opposite to the first housing side. Outside of the building or data processing center, a second heat exchanger packet is arranged and has air blown through it by a second blower. A cooling arrangement of this type is described in DE 10 2013 111 053 A1.

SUMMARY OF THE INVENTION

Especially in the case of air conditioning applications in the data processing center area, in which the cooling unit housing can be integrated, for example as an inline unit in a bayed enclosure suite, the cooling powers to be applied per cooling arrangement, fall in the range of, for example, 35 kW or more, which once again makes it necessary for the recooling units having the second heat exchanger packet in the outdoor area to be designed as active recoolers, for example as chillers, in order to supply the recooling necessary for the cooling power to be supplied in the building or data processing center.

The cooling efficiency of chillers, however, depends strongly upon the temperature relationships between the building or data processing center and the environment of the data processing center, especially upon the temperature difference between a target or actual temperature in the building or data processing center and the outdoor environment of the data processing center, wherein the temperature of the outdoor environment of the data processing center is strongly dependent on the season. In particular, therefore, the recooling power of the chiller is therefore designed to always supply adequate recooling even at maximal outside temperatures, for example at temperatures of more than 35° C. However, since in many regions of the earth, these extreme temperatures are reached only on a relatively small number of days each year, for most of the time, the chiller operates in an inefficient cooling power range, relative to its design.

Therefore the goal of the invention is to further develop a cooling arrangement of the type initially described such that it can be operated in an energy-efficient manner, even at various ambient temperatures.

Correspondingly it is provided that a first and a second coolant circuit are conveyed, separated fluidically from one another, between the first heat exchanger packet and the second heat exchanger packet, wherein the first cooling circuit is a passive cooling circuit and the second cooling circuit is a compressor circuit. By combining a passive cooling circuit and a compressor cooling circuit it is accomplished that at least part of the cooling power to be applied can be supplied through the passive cooling circuit, with the passive cooling circuit providing relief for the compressor cooling circuit. This in turn means that the cooling power that may have to be supplied by the compressor circuit in addition to the cooling power of the passive cooling circuit is low enough so that the recooling power to be supplied by the second heat exchanger packet in the outdoor area is correspondingly low, and in particular this makes it possible for the recooling of the compressor circuit to be provided through the second heat exchanger packet alone via a condenser designed as an air-coolant heat exchanger in the compressor circuit and thus the use of energy-consuming recooling units, especially the use of chillers, is no longer necessary.

The first heat exchanger packet therefore may have a first air-coolant heat exchanger, which is an evaporator of the compressor circuit, and a second air-coolant heat exchanger, through which the liquid coolant of the passive cooling circuit is conducted. Correspondingly the second heat exchanger packet can have a third air-coolant heat exchanger, which is a condenser in the compressor circuit, and a fourth air-coolant heat exchanger, through which the liquid coolant of the passive cooling circuit is conducted.

The air flowing through the second heat exchanger packet can flow in the air flow direction through the second heat exchanger packet of the fourth air-coolant heat exchanger of the passive cooling circuit before the condenser of the compressor circuit.

The cooling arrangement also makes it possible, in particular, for a recooling unit, which is disposed in the outdoor area and has the second heat exchanger packet, to be designed as a compact component. In particular it is possible that through the design of the third and the fourth heat exchanger as air-coolant heat exchangers, the two heat exchangers can be connected one after the other in the air flow direction through the two heat exchangers, and correspondingly the same blower or blowers can be used for passing the air through both heat exchangers. In particular, additional pumps, compressors, expansion means and the like also become superfluous.

The third and fourth heat exchangers of the second heat exchanger packet can be accommodated, vertically stacked one atop the other, in a recooler housing, wherein the condenser of the compressor circuit is disposed above the fourth air-coolant heat exchanger of the passive cooling circuit and the condenser and the fourth air-coolant heat exchanger of the passive cooling circuit are passed through successively by ambient air in a vertical direction.

An air inlet side of the fourth air-coolant heat exchanger of the passive cooling circuit can form an air inlet of the second heat exchanger packet, and an air outlet side of the condenser can form an air outlet of the second heat exchanger packet.

The side walls of the recooler housing can be formed by a circumferentially closed vertical side wall edging of the second heat exchanger packet, which aligns the third and the fourth heat exchangers with one another and covers their sides, so that an air flow direction is formed through the second heat exchanger packet in parallel to the side wall edging and thus in the vertical direction.

The air-coolant heat exchangers of the second heat exchanger packet can have parallel heat exchanger fins, adjacent heat exchanger fins of which form an air channel in each case permeable in the vertical direction through the third and fourth air-coolant heat exchangers.

The air channels of the third and fourth air-coolant heat exchangers of the second heat exchanger packet can be aligned in pairs flush with one another, wherein the flush air channels in each case are guided between the air inlet side of the fourth air-coolant heat exchanger of the passive cooling circuit and the air outlet side of the condenser.

BRIEF DESCRIPTION OF THE DRAWINGS

Further details of the invention will be illustrated based on FIG. 1, which shows, in a schematic view, an exemplified embodiment of a cooling arrangement according to the invention.

DETAILED DESCRIPTION OF THE PREFERRED EMBODIMENTS

The cooling arrangement (1) has a cooling unit housing (2) disposed in an IT environment, for example in a data processing center, which for example may be queued as an in-line device in a bayed enclosure suite in a cold aisle-warm aisle arrangement. Thus the cooling unit housing (2) is aligned for example to draw air, for example heated air, over a first of two opposite sides (6, 7) from a warm aisle and blow it out over a second side (7) located opposite to the first side as cooled air into a cold aisle.

For this purpose, a first heat exchanger packet (3) is incorporated in the cooling unit housing (2). To produce the described air flow, the cooling unit housing (2) has at least one first blower (4). In the outdoor area, a recooler housing (15) connected fluidically with the cooling unit housing (2) is arranged, having a second heat exchanger packet (8) incorporated within it. The recooler housing (15) has second blowers (5), which generate a defined air flow in the y-direction through the second heat exchanger packet (8).

Each of the first and the second heat exchanger packets (3, 8) has two air-coolant heat exchangers (11, 12; 13, 14). The first heat exchanger packet (3) has a first air-coolant heat exchanger (11) and a second air-coolant heat exchanger (12). The second heat exchanger packet (8) has a third air-coolant heat exchanger (13) and a fourth air-coolant heat exchanger (14). The first air-coolant heat exchanger (11) forms an evaporator of a compressor circuit (10), through which the first air-coolant heat exchanger (11) is fluidically connected with the third air-coolant heat exchanger (13), wherein the latter correspondingly forms a condenser of the compressor circuit (10). The second air-coolant heat exchanger (12) is fluidically connected over a passive cooling circuit (9) with the fourth air-coolant heat exchanger (14). The compressor circuit (10), besides the evaporator (11) and the condenser (13), has a compressor (22) and an expansion valve (23). In addition, the compressor circuit can be designed in the manner of a conventional compressor circuit, as is known for IT cooling applications from the prior art. The compressor circuit (10) and the passive cooling circuit (9) are fluidically separate from one another. The passive cooling circuit (9), in addition to the two air-coolant heat exchangers (12, 14), has a pump (21), through which a coolant is circulated between the two air-coolant heat exchangers (12, 14).

The third and fourth air-coolant heat exchangers (13, 14) are disposed in the recooler housing (15) in the vertical direction one above the other, wherein the two heat exchangers (13, 14) are specifically permeable to air in the vertical direction, so that the second blowers (5) produce an air flow direction (Y) which is specifically aligned in the vertical direction. The second blowers (5) are specifically aligned to generate the air flow in the vertical direction from bottom to top. As a result, the ambient air flows through the fourth air-coolant heat exchanger (14) of the passive cooling circuit before the third air-coolant heat exchanger (13) of the compressor circuit (10), so that at least most of the required recooling performance and thus most of the required cooling power of the first heat exchanger packet (3) can be supplied by the fourth air-coolant heat exchanger and consequently the compressor circuit (10) need only supply any missing portion of the cooling fraction. In addition, the compressor circuit (10) can be timed, with appropriately extended timing intervals. However, the compressor circuit (10) can also have a rotation speed-regulated compressor (22), wherein the cooling arrangement according to the invention makes it possible for the compressor (22) to be operated in an energy-optimized, low rotation speed range to supply the additional cooling power that may be supplied and that cannot be provided by the passive cooling circuit (9).

The third and fourth heat exchangers (13, 14) are disposed in the cooling unit housing (15) one above the other, so that they form a compact unit. In particular it may be provided that the recooler housing (15) has a side wall edging (18) that is specifically an edging for the second heat exchanger packet (8) and which defines an air flow direction through the second heat exchanger packet (8) in parallel to the side wall edging (18) and thus in the vertical direction (y). The second heat exchanger packet (8) has parallel heat exchanger fins (19), which form air channels (20) permeable in the y-direction through the two heat exchangers (13, 14). The third and fourth heat exchangers (13, 14) can be aligned with one another such that the air channels (20) of the two heat exchangers (13, 14) are flush with each other in pairs, wherein the flush air channels (20) in each case are guided between the air inlet side (16) of the fourth air-coolant heat exchanger (14) of the passive cooling circuit and the air outlet side (17) of the condenser. Thus outside of the second heat exchanger packet (8) the recooler housing (15) must additionally have only at least one second blower (5) for generating a defined air flow in the y-direction. No other active components such as compressors, expansion valves or the like are required, so that the recooler housing (15) at least compared to chillers and other active recooling components can be kept simple in design and has a low energy consumption.

The features of the invention disclosed in the above description, in the drawing and in the claims can be essential both individually and in any combination for realizing the invention.

LIST OF SYMBOLS

1 Cooling arrangement
2 Cooling device housing
3 First heat exchanger packet
4 First blower
5 Second blower
6 Air inlet side
7 Air outlet side
8 Second heat exchanger packet
9 Passive cooling circuit 10 Compressor circuit
11 First air-coolant heat exchanger
12 Second air-coolant heat exchanger
13 Third air-coolant heat exchanger
14 Fourth air-coolant heat exchanger
15 Recooler housing
16 Air inlet side of the fourth air-coolant heat exchanger
17 Air outlet side of the condenser
18 Side wall edging
19 Heat exchanger fan
20 Air guide channel
21 Pump
22 Compressor
23 Expansion valve
y Air flow direction through second heat exchanger packet

What is claimed is:

1. A cooling arrangement for air conditioning an IT environment housed inside a building, the cooling arrangement comprising:
a cooling unit housing for cooling the IT environment;
a first heat exchanger packet included with the cooling unit housing;
a first blower included with the cooling unit housing, wherein the first blower is disposed to draw air from the building into the cooling unit housing through a first housing side of the cooling unit housing, to convey air through the cooling unit housing and the first heat exchanger packet, and to blow air out of the cooling unit housing over a second housing side located opposite the first housing side;
a second heat exchanger packet for disposition outside of the building housing the IT environment;
at least one second blower for blowing air through the second heat exchanger packet;
a passive cooling circuit and a compressor cooling circuit fluidly separate from one another and both extending between the first heat exchanger packet and the second heat exchanger packet;
a condenser of the compressor cooling circuit, the condenser included in the second heat exchanger packet;
an air-coolant heat exchanger of the second heat exchanger packet through which the liquid coolant of the passive cooling circuit is conducted; and
a recooler housing including the condenser vertically stacked on top of the air-coolant heat exchanger of the second heat exchanger packet, such that air vertically passing through the second heat exchanger packet passes successively through the air-coolant heat exchanger of the second heat exchanger packet and then the condenser.

2. The cooling arrangement according to claim 1, wherein the first heat exchanger packet has a first air-coolant heat exchanger that is an evaporator of the compressor cooling circuit, and a second air-coolant heat exchanger, through which the liquid coolant of the passive cooling circuit is conducted.

3. The cooling arrangement according to claim 1, in which the air flowing through the second heat exchanger packet in an air flow direction (y) flows through the air-coolant heat exchanger of the second heat exchanger packet of the passive cooling circuit before flowing through the condenser of the compressor cooling circuit.

4. The cooling arrangement according to claim 1, wherein an air inlet side of the air-coolant heat exchanger of the second heat exchanger packet forms an air inlet of the second heat exchanger packet and an air outlet side of the condenser forms an air outlet of the second heat exchanger packet.

5. The cooling arrangement according to claim 1, wherein side walls of the recooler housing are formed by a circumferentially closed vertical side wall edging of the second heat exchanger packet, the vertical side wall edging aligns the condenser and the air-coolant heat exchanger of the second heat exchanger packet relative to one another and provides edging at sides of the recooler housing so that an air flow direction is formed through the second heat exchanger packet in parallel to the side wall edging and thus in a vertical direction.

6. The cooling arrangement according to claim 5, wherein the condenser of the compressor cooling circuit and the air-coolant heat exchanger of the second heat exchanger packet have parallel heat exchanger fins, adjacent heat exchanger fins form an air channel that is permeable in the vertical direction.

7. The cooling arrangement according to claim 6, wherein the air channels are aligned flush with one another in pairs, wherein the flush air channels in each case are conducted between an air inlet side and an air outlet side.

* * * * *